United States Patent
Rumsey

(10) Patent No.: US 6,889,902 B2
(45) Date of Patent: *May 10, 2005

(54) DESCRIPTOR FOR IDENTIFYING A DEFECTIVE DIE SITE AND METHODS OF FORMATION

(75) Inventor: Brad D. Rumsey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 22 days.

This patent is subject to a terminal disclaimer.

(21) Appl. No.: 10/170,508

(22) Filed: Jun. 12, 2002

(65) Prior Publication Data

US 2002/0148897 A1 Oct. 17, 2002

Related U.S. Application Data

(63) Continuation of application No. 09/650,796, filed on Aug. 30, 2000, now Pat. No. 6,415,977.

(51) Int. Cl.⁷ ................................................ G06K 7/14
(52) U.S. Cl. ..................... 235/454; 235/449; 257/431; 257/432
(58) Field of Search ................ 235/454, 492, 235/494, 449, 575, 792; 257/431–435, 678; 702/35; 438/14–17

(56) References Cited

U.S. PATENT DOCUMENTS

| | | | |
|---|---|---|---|
| 4,255,851 A | | 3/1981 | Fortuna |
| 4,437,229 A | | 3/1984 | Bitler et al. |
| 4,510,673 A | | 4/1985 | Shils et al. |
| 4,585,931 A | | 4/1986 | Duncan et al. |
| 4,787,143 A | | 11/1988 | Yagi et al. |
| 4,868,974 A | * | 9/1989 | Nishiguchi ................ 29/740 |
| 5,118,369 A | | 6/1992 | Shamir |
| 5,175,425 A | | 12/1992 | Spratte et al. |
| 5,197,650 A | | 3/1993 | Monzen et al. |
| 5,256,578 A | * | 10/1993 | Corley et al. ............... 700/121 |
| 5,284,364 A | | 2/1994 | Jain |
| 5,406,367 A | | 4/1995 | Sopori |
| 5,546,179 A | | 8/1996 | Cheng |
| 5,654,204 A | | 8/1997 | Anderson |
| 5,808,735 A | | 9/1998 | Lee et al. |
| 5,962,862 A | | 10/1999 | Evers et al. |
| 5,982,920 A | * | 11/1999 | Tobin et al. ................. 382/145 |
| 6,018,686 A | * | 1/2000 | Orso et al. .................. 700/121 |
| 6,021,380 A | | 2/2000 | Fredriksen et al. |
| 6,127,069 A | | 10/2000 | Balz et al. |
| 6,169,960 B1 | * | 1/2001 | Ehrichs ....................... 702/36 |
| 6,324,298 B1 | | 11/2001 | O'Dell et al. |
| 6,392,289 B1 | * | 5/2002 | Tandy ......................... 257/678 |
| 6,548,764 B1 | * | 4/2003 | Prindiville et al. ......... 174/255 |
| 6,644,982 B1 | * | 11/2003 | Ondricek et al. ............. 439/73 |

FOREIGN PATENT DOCUMENTS

JP     05-206237     8/1993

* cited by examiner

Primary Examiner—Michael G. Lee
Assistant Examiner—Ahshik Kim
(74) Attorney, Agent, or Firm—TraskBritt

(57) ABSTRACT

The present invention relates to the marking and identification of defective die sites on a mounting substrate. A mounting substrate is provided which is inspected and tested for visual and electrical defects. Information relating to the functionality and/or various defects of one or more die sites is then encoded in the form of a designator placed on the substrate. The information encoded on the designator may then be read or scanned by, for example, computer-driven video equipment and used in a die-attach process to discriminately place semiconductor dice only on known good die sites. Embodiments of the designator include information encoded in the form of a bar code, a series of identifying marks, a strip of magnetic tape or a computerized map of a mounting substrate. Correlated data regarding die site functionality can then be electronically transferred to a die-bonding apparatus.

10 Claims, 4 Drawing Sheets

DESCRIPTOR FOR IDENTIFYING A DEFECTIVE DIE SITE AND METHODS OF FORMATION

CROSS-REFERENCE TO RELATED APPLICATION

This application is a continuation of application Ser. No. 09/650,796, filed Aug. 30, 2000, now U.S. Pat. No. 6,415,977, issued Jul. 9, 2002.

BACKGROUND OF THE INVENTION

1. Field of the Invention

This invention relates generally to marking techniques for semiconductor substrates. More specifically, the present invention relates to methods and apparatus for marking and identifying defective die sites on semiconductor mounting substrates.

2. State of the Art

In the fabrication of semiconductor packages, semiconductor dice (also known as "semiconductor devices" or "semiconductor chips") are typically mounted and electrically connected to carrier substrates appropriate for the chip type and the subsequent use of the package. For example, chip-on-board (COB), board-on-chip (BOC), ball grid array (BGA), chip-scale, or leads-over-chip (LOC) mounting arrangements may be made on printed circuit board strips, tape frames and other carrier substrates known in the art. After die attach (the mounting of the semiconductor die to the carrier substrate), the hybrid combination of components is electrically connected, generally through wire bonding, conductive adhesives or solder reflow, then encapsulated for protection. The finished package is then made available for use in a wide variety of applications.

Semiconductor dice and carrier substrates are distinct components which are manufactured by separate processes. Individual integrated circuit dice are usually formed from a larger structure known as a semiconductor wafer, which is typically comprised primarily of silicon, although other materials such as gallium arsenide and indium phosphide are also sometimes used. Each semiconductor wafer has a plurality of integrated circuit semiconductor dice and/or circuitry, arranged in rows and columns with the periphery of each integrated circuit being substantially rectangular in shape, the integrated circuits of the semiconductor die being formed through a combination of deposition, etching, and photo-lithographic techniques. The inactive silicon backsides of the wafers are typically thinned (i.e., have their cross sections reduced) by a mechanical and/or chemical grinding process, and the wafers sawed or "diced" into substantially rectangularly shaped discrete integrated circuit semiconductor dice. The nature and complexity of the process for fabricating integrated circuits make the manufacturing cost of an individual semiconductor die relatively high.

With respect to the various carrier substrates for COB, BOC, BGA, LOC, chip-scale, and other types of packages, each of the carrier substrates is generally manufactured with several common features: an attachment site for at least one semiconductor die, a plurality of bond pads and conductive traces for interconnecting conductors on one or more semiconductor dice, a resist or insulating layer for electrically isolating the conductive traces and interconnections, tooling holes on the substrate edges for automated machine handling, and alignment marks for semiconductor die placement, wire bonding, and substrate orientation. The electronic properties and performance of the carrier substrate are determined by precise characteristics of the conductive layers and insulation layers which form it, including the composition, thickness, and surface quality of the various types of layers.

Currently, many carrier substrates (also referred to as "mounting substrates") have multiple die-attach sites per carrier strip, which may further be formed in an array arrangement of several across. Such high-density arrays are suitable for increased throughput in automated processing, such as die-attach processing, as well as desirable for use in various electronics applications. For example, arrays of three rows of three semiconductor die sites across are commonly used on a single printed circuit board strip. An exemplary array for a BGA-type carrier substrate 1 is shown in drawing FIG. 1. Semiconductor die sites 10, for mounting and electrical attachment of a semiconductor die, are configured in an arrangement of three across the substrate strip. Pin one indicators 11 and fiducial marks 12, which provide orientation for vision systems associated with automated machine handling and semiconductor die placement apparatus (not shown), are formed as openings in a layer of solder resist 3 on carrier substrate 1. Semiconductor die sites 10 are shown with solder balls 16 of the BGA surrounding each semiconductor die receiving area 14 with solder balls 16 configured in a ball grid array arrangement 54. The solder balls 16 are typically placed on contact pads (not shown), which are further electrically interconnected to circuit traces (not shown) underlying a passivation layer of solder resist 3 on the surface of the carrier substrate 1. The circuit traces are, in turn, electrically connected to other contact pads within or immediately proximate semiconductor die sites 10.

After die attach, conductive wires extending from the active surface of the mounted semiconductor die are typically wire bonded onto the contact pads in the die site of the carrier substrate 1. The conductive traces, contact pads, and other contact pads are typically formed by laminating or depositing a metal material (e.g., copper) onto a base insulating substrate material. Subsequent photo-lithographic and etching techniques are then used to define the actual conductive patterns.

Referring again to drawing FIG. 1, carrier substrate 1 also includes a layer of solder resist 3. The layer of solder resist 3 is applied using photo-lithographic processes onto carrier substrate 1, and serves to mask or shield conductive members on the top and bottom carrier substrate surfaces during subsequent soldering and/or plating processes and/or various other processes. Various solder resist materials are well known and commercially available for such processes. With respect to the surface of carrier substrate 1, solder resist layer 3 masks all portions of the surface except the semiconductor die sites 10 and the contact pads for placement of solder balls 16. As previously described, pin one indicator 11 and fiducial marks 12 are typically formed as openings in solder resist layer 3 subsequent to the deposition of solder resist layer 3. Any conductive elements within semiconductor die site 10 thus remain exposed, as does at least a portion of the contact pads, after application of solder resist layer 3 to the top surface of the carrier substrate 1.

In the process of die attach, a die-attach apparatus typically uses a vision system to locate a fiducial mark, pin one indicator, and/or any other alignment feature on the lead frame or other mounting substrate. Using an X-Y table for proper alignment, the vision system checks the semiconductor die position on the die pickup tool and directs the apparatus to adjust the substrate and die pickup tool into the correct positions for precise semiconductor die placement.

Typically, semiconductor dice are presented to a die-attach apparatus in sawed wafer form and are mounted on wafer tape for attachment on metal lead frames or any suitable substrate. For some die-attach apparatus, semiconductor dice may also be presented in gel or waffle pack form for attachment to the desired substrate. In the die-bonding process, semiconductor dice are selectively picked from those of wafers respectively probe-tested in their manufacturing factories using various testing equipment. To orient the semiconductor dice, the die bonder's vision system identifies a feature on a die and directs the X-Y table to pick up and align the die in the X, Y, and theta directions. Meanwhile, a mounting substrate has been indexed to the die-attach site and properly oriented. At the die-attach site, a precise amount of adhesive, such as epoxy resin, is applied. The picked-up die is then bonded to the die-attach site of the mounting substrate via the adhesive.

Since semiconductor dice are high-grade products with highly integrated structures, the cost per semiconductor die may be high. Prior art die-attach processes, however, tend to focus on methods of dealing with defective semiconductor dice and not defective die sites on a mounting substrate. For this reason, it is desirable to classify, map and selectively reject defective die sites of substrates prior to the mounting of functional semiconductor dice thereat.

In each batch of manufactured semiconductor dice and substrate components, a small percentage of the substrate components will be defective. In an effort to minimize the costs and maximize the quality of assembled packages, steps are typically taken to ensure that only semiconductor dice and substrate components which are found to be functional are assembled with one another. Therefore, prior to the die attachment process, wafers, semiconductor dice and carrier substrates are typically tested for electrical defects, contamination, and other irregularities. Semiconductor dice and substrates that are found to be defective are typically marked in a manner so as to distinguish them from known good components.

There are numerous teachings relating to the marking and/or mapping of defects in semiconductor wafers and semiconductor dice. One method for marking used extensively in the semiconductor industry is to use colored ink dots to label semiconductor dice which have failed testing procedures. These ink dots can be read by a vision system for automated pick-and-place processing. For example, U.S. Pat. No. 5,654,204 to Anderson discloses a process in which a wafer is electronically mapped, individual semiconductor dice are tested, and a wafer map identifying the defective semiconductor dice is produced and provided to an automated inking apparatus.

In U.S. Pat. No. 5,256,578 to Corley et al., a method for wafer map recording is disclosed wherein individual active dice are tested for functionality while in wafer form. The active dice are then categorized based on functional results, and the testing results are summarized on a wafer map. A binary code is then generated which contains the entire wafer map information. This information is recorded on the semiconductor wafer by laser scribing, and the results used for either manual or automated die selection.

In U.S. Pat. No. 6,021,380 to Fredriksen et al., a scanner is employed to produce a virtual image of the wafer, identifying all chips even when diced apart. A vision system uses the virtual wafer image to sort out defective chips, and gross defects identified by the vision system process are classified and marked in a computer-stored wafer map.

Various patents, such as U.S. Pat. No. 5,175,425 to Spratte et al., U.S. Pat. No. 4,585,931 to Duncan et al., and U.S. Pat. No. 4,510,673 to Shils et al., are directed to assorted other semiconductor marking techniques. The patents to Spratte et al. and Duncan et al. disclose processes for laser marking and identifying semiconductor wafers with a machine readable bar code, while the patent to Shils et al. discloses a method of laser marking the backside of individual dice with a unique identifying code.

The prior art of identifying and marking defective carrier substrates is less expansive than the art dealing with defective semiconductor wafers or dice. When irregularities are found on individual die sites of a carrier substrate strip, the entire strip is ordinarily not rendered unusable unless a substantial number of the die sites are found to be defective. For some strips, defective sites constituting 10% or greater of the total of die sites will justify discarding the entire strip. In other strip arrays, higher numbers of defective die sites are tolerated. When a defective die site is identified on a substrate, typically by automated testing apparatus or a vision system, conventional practice is for an operator to manually "x-out" or "ink-out" a feature of the defective die site, rendering the feature "unreadable" by the vision recognition system of an automatic die-bonding apparatus. A relatively simple system of vision recognition is a black and white digital recognition system (DRS), which can recognize inked-out features and streets between die-attach sites. In more sophisticated operations, a pattern recognition system (PRS) is used as a vision system to identify defects and to recognize inked-out features. The PRS can also be used to align a bond pad with a die.

The "inking out" is usually accomplished by marking over an exposed feature in the solder resist which is a component of the defective die site, completing the mark with an ink pen, for example. As used herein, the term "exposed feature" denotes an opening in the solder resist which typically exposes a visibly discernable Au/Ni/Cu surface. Features which are commonly "inked out" include pin one indicators, bond pads, and/or fiduciary marks. Illustrated in drawing FIG. 2 is a BGA substrate strip of drawing FIG. 1 with multiple die sites 10, wherein a substrate area around die site 10a is shown containing a conventional inked-out feature consisting of an inked-out pin one indicator 11a.

When an array with one or more "inked-out" die sites is placed in an automated die-attach apparatus, data from the digital or pattern recognition system and/or testing systems is fed into a processor, the processor interpreting the data to instruct the die-attach apparatus to skip over the defective die sites.

There are, however, potential problems associated with identifying defective die sites by manually inking-out one or more features. First, the small size of the die sites and the features thereon make it difficult for an operator to perform the "ink-out" step on a defective site without marking through features of other "good" die sites nearby. Secondly, the ink from a mark may bleed, smear, or spray in some cases, thereby causing contamination of adjacent die sites. Additionally, the manual marking of defective sites is a relatively slow process. By automating the marking process, throughput could be increased substantially, and the potential for substrate contamination and operator error substantially reduced.

It is also the case, however, that automated processes for the marking of defective substrates have been known in the art. U.S. Pat. No. 4,437,229 to Bitler et al. discloses a method of marking defective electronic articles in an array arrangement. The method entails forming film circuit articles in the array with added test pads and resistive elements, and electrically altering a resistive element to a relatively high resistive value when a defective circuit is found. The article substrate (an array of film circuits) is subsequently fed into a holding apparatus which measures the resistive value of the resistive element, thereby labeling the substrate as acceptable or defective. The holder then transfers this data to a microprocessor within a die-bonding apparatus. The die bonder then directs chips to be bonded only to those array circuits which have been labeled as functional by virtue of their low resistive values.

U.S. Pat. No. 4,787,143 to Yagi et al. discloses a method for applying a code mark to a substrate to which electronic parts are to be mounted. The code mark, which may be a bar code, is formed on the substrate prior to the mounting of a semiconductor die. Once the semiconductor die is mounted on the substrate, a mounting failure detection mechanism on a die mounting apparatus serves to automatically detect an incorrect or defective mounting of the die. The mounting failure detection system is further configured with a code reader for reading the code mark of each substrate and a control box for generating mounting failure data. Yagi et al. teaches that when a mounting failure has been detected, a mounting failure data edit controller collates mounting failure data supplied from the control box with the code signals from the code reader, then uses the data to classify and automatically separate defective substrates from good ones.

U.S. Pat. No. 5,197,650 to Monzen et al. teaches placing an identifier, preferably a bar code, on a lead frame prior to the mounting of semiconductor dice. Semiconductor dice are first tested, then mounted to the lead frame. As the dice are mounted, an information processing unit adds information about the lead frame to the semiconductor die test results. The accumulated data is then forwarded to the next phase of the packaging process, which may be wire bonding, for example. The wire bonding apparatus receives the combined data and uses it accordingly to perform wire bonding operations. Monzen et al., however, does not teach that the bar code contains information about defective semiconductor die sites. Instead, Monzen et al. teaches that all the dice, even the defective ones, are mounted to the lead frame, and that the identifying information on the bar-coded lead frame is combined with the semiconductor die test results to be employed at later stages after semiconductor die bonding.

As can be seen from the foregoing, the method of manually inking-out a defective semiconductor die site is troublesome and inefficient. Furthermore, the prior art automated processes dealing with defective carrier substrates either allow the attachment of the semiconductor die to a defective site, thus sacrificing a good semiconductor die, or, in the case of U.S. Pat. No. 4,437,229 to Bitler et al., require the additional steps of adding a test pad and a resistive element to the circuits on the substrate. Accordingly, what is needed in the art is a method of marking a defective semiconductor die site which is automated, accurate, low cost, relatively simple, and has high throughput. In addition to the foregoing characteristics, a marking method is needed which can be read by die-bonding apparatus to ensure that only functional semiconductor die sites are provided with semiconductor dice.

BRIEF SUMMARY OF THE INVENTION

The present invention comprises methods and apparatus relating to the marking and identification of defective semiconductor die sites on a mounting substrate prior to die attach. In this regard, a mounting substrate is provided and inspected and tested for visual and electrical defects. The inspection and testing data are then compiled and correlated with individual semiconductor die sites. Information relating to the functionality and/or various defects of one or more semiconductor die sites is then encoded in the form of a designator (also referred to as a "descriptor"). The information encoded on the designator may then be read or scanned by, for example, computer-driven video equipment, and then processed for use in a die-attach process to place semiconductor dice only on known good die (KGD) sites, as indicated by the inspection and testing data.

Preferably, the designator of the present invention is located externally from each die site area of a mounting substrate. In one embodiment, the designator is located on an unused peripheral surface portion of a mounting substrate. The designator preferably comprises information encoded in the form of a bar code, or series of identifying marks. The designator also preferably comprises a strip of magnetic tape with information programmed thereon. In a further embodiment, the compiled inspection and test information can be correlated with individual semiconductor die sites and a particular substrate configuration to create a computerized map of a mounting substrate. Data relating to defective semiconductor die sites on the substrate can thus be stored in computer memory and transferred electronically to a die-bonding station in furtherance of a die-attach process.

In addition to information concerning the functionality of semiconductor die sites on a substrate, the information encoded on the designator may include manufacturing information, such as the various process specifications used in forming the mounting substrate. The encoded information may also include testing specifications and parameters, as well as identifying information, such as lot number, and time, date and place of manufacture, etc. When scanned or read by a computer, this information can be used, for example, in fault verification and fault isolation analysis.

The present invention takes up no real estate on a semiconductor die site, and thus is particularly advantageous when used in combination with substrate arrays for producing chip scale, or near chip scale, packages. The invention also requires no openings in the solder resist of an individual semiconductor device package, thus allowing for a more planar solder resist surface for clamping to reduce resin bleed during a mold encapsulation process. The present invention further avoids the problems inherent in "inking-out" the very small unique features on semiconductor die sites, including problems associated with operator error and ink contamination due to ink bleeding, smearing, or spraying. Finally, the present invention provides for a completely automated process of identifying and recording multiple defective semiconductor die sites on a substrate, thus allowing throughput to be increased substantially.

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
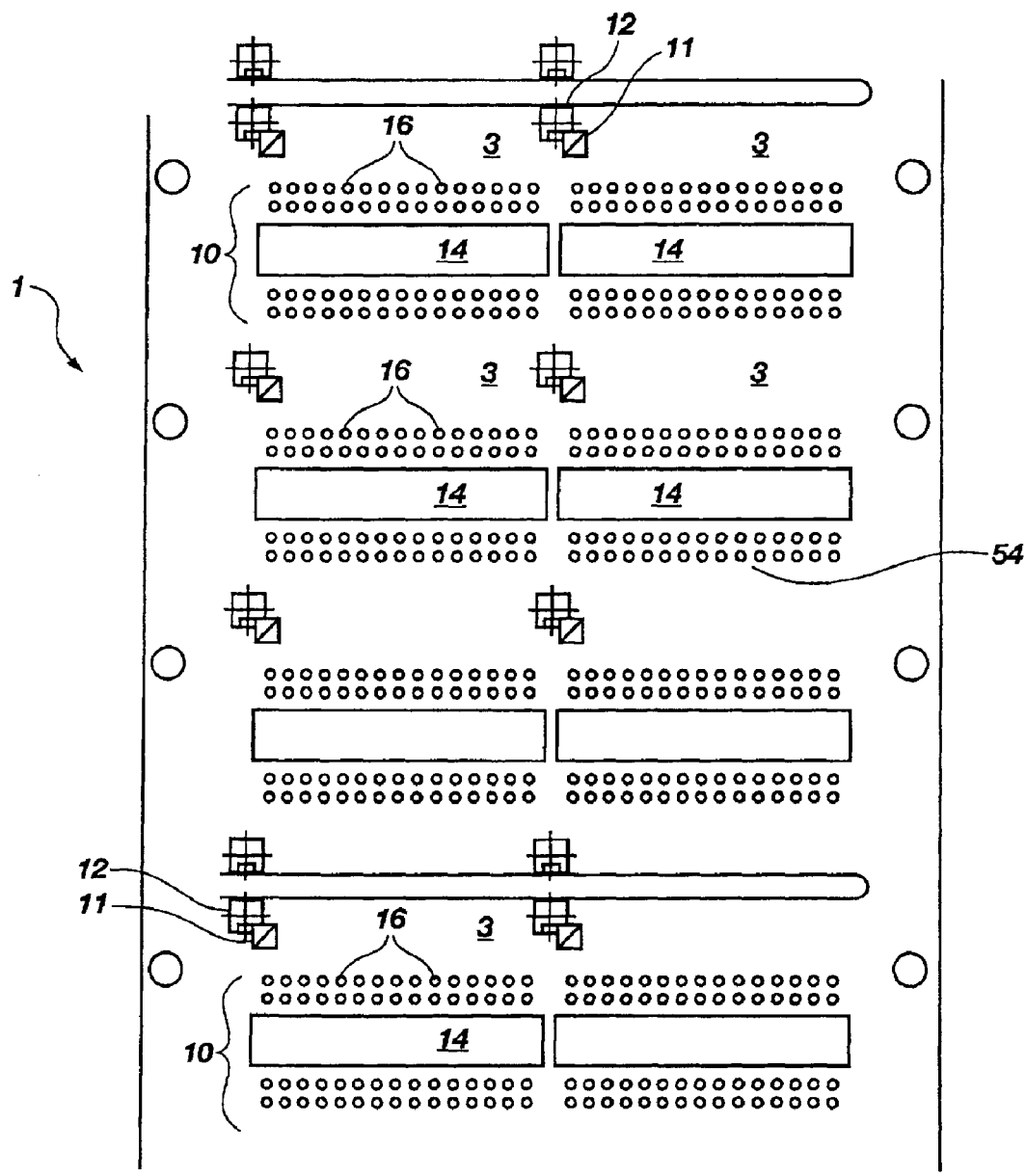
FIG. 1 illustrates a top view of an exemplary BGA-type carrier substrate with multiple semiconductor die sites thereon.
Figure 2:
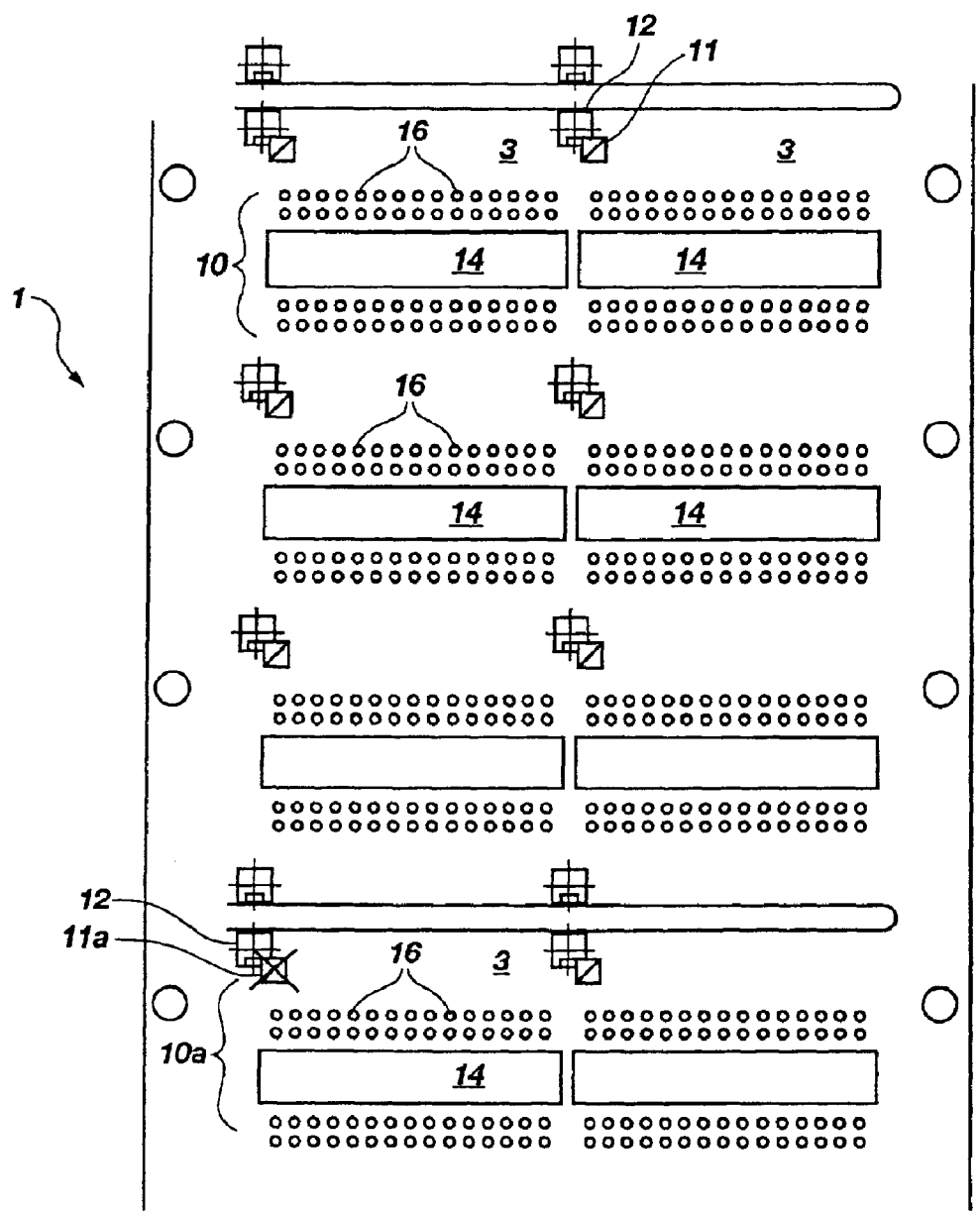
FIG. 2 illustrates the prior art process of marking a defective semiconductor die site by "inking-out" a unique feature on the defective semiconductor die site.
Figure 3:
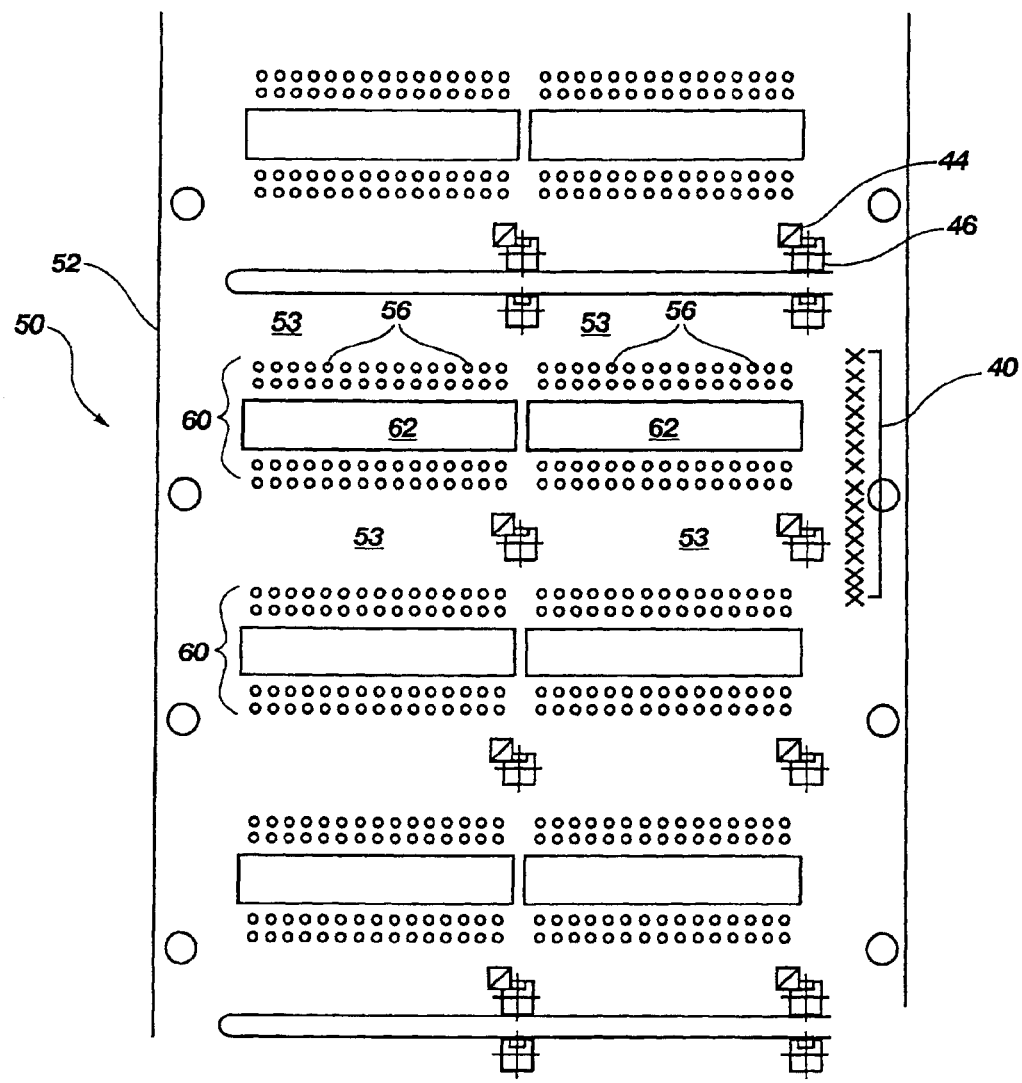
FIG. 3 shows a top view of a BGA-type carrier substrate configured with multiple semiconductor die sites and using a designator of the present invention to encode information regarding the functionality of individual semiconductor die sites.

As illustrated in drawing FIG. 3, an exemplary mounting substrate array 50 for use in the present invention includes a substrate body 52 with a layer of solder resist 53 formed on a surface thereof, and a plurality of semiconductor die sites 60, each semiconductor die site 60 including a die receiving area 62 with electrical conductors interconnected thereto. The substrate body 52 is, for example, a multilayer printed wiring board. Formed as components of each semiconductor die site 60 are various electrical conductors, including bond pads (not shown), circuit traces (not shown), and solder ball contact pads 56, and a die receiving area 62. Other contact pads are provided on the substrate body 52 for interconnection to a mounted integrated circuit die by wire bonding or other means. Conductive (circuit) traces (not shown) underlie the layer of solder resist 53 and extend from the other contact pads to solder ball contact pads 56, upon which solder balls (not shown) may be subsequently formed. As shown, solder ball contact pads 56 are configured in a preselected array pattern surrounding each of semiconductor die sites 60. After die attach, solder ball contact pads 56 with solder balls disposed thereon will comprise connective elements forming a ball grid array around each semiconductor die site 60 for external communication with a printed wiring board, other BGA package, module board, etc. Solder resist layer 53, which is typically an insulation film formed of an insulation resin, is disposed on substrate body 52 to prevent electrical shorting of conductive traces underlying the resist, as well as to provide protection from contaminants and aid vision systems of automated die-attach apparatus in determining the correct mounting orientation for the placement of semiconductor dice on semiconductor die sites 60. Pin one indicators 44 and/or fiducial marks 46 may also be provided. On an otherwise unused peripheral surface area portion of substrate body 52, a designator 40 for encoding information relating to mounting substrate array 50 is illustrated.

As referred to herein, the term "semiconductor die site" includes a portion of a substrate configured for receiving a semiconductor die as well as any electrical conductors associated with the substrate portion. Most generally, the term "semiconductor die site" refers to all components and regions of a substrate which will comprise an integral part of an individual semiconductor die package once a semiconductor die has been associated therewith. As such, the components making up a "semiconductor die site" may be provided on one or both opposing surfaces of a substrate. In certain applications, the term "semiconductor die site" may further include external interconnection components, such as solder balls disposed on a conductor, found in individual semiconductor device packages.

As used herein, the phrase "an otherwise unused peripheral surface area portion" of a substrate or substrate array refers to a substrate region which takes up no real estate or space within an individual semiconductor device package once singulated or separated or otherwise separated from a mounting substrate or mounting substrate array. Thus, a general use of the phrase "an otherwise unused peripheral surface area portion" refers to substrate surface areas which are "off-site" (outside of each of the semiconductor die site areas). Preferably, the phrase "an otherwise unused peripheral surface area portion" of a substrate also refers to substrate areas which are outwardly located from areas of a substrate used for clamping during an encapsulation mold process. Designator 40 is preferably sized to have all portions thereof remain within the otherwise unused peripheral surface area portion, as defined above. A designator 40 placed on an otherwise unused peripheral surface area portion of a substrate thus advantageously takes up no space or real estate within an individual semiconductor device package, and preferably creates no openings in the solder resist.

It is understood that although the exemplary mounting substrate array 50 is presented as comprising a printed wiring board with multiple semiconductor die sites and more than one ball grid array for external interconnection capability of individual packages, the particular mounting substrate array shown is for illustrative purposes only. Further, one of skill in the art will recognize that the methods of the present invention are applicable to any type of prior art mounting substrate or mounting substrate array which includes one or more semiconductor die site areas to which semiconductor dice are to be mounted and electrically connected. As one example, a mounting substrate array 50 may comprise a length of lead frames, the length of lead frames configured with an array, each lead frame having a semiconductor die-attach paddle and a plurality of leads for interconnection with a semiconductor die.

Figure 4:
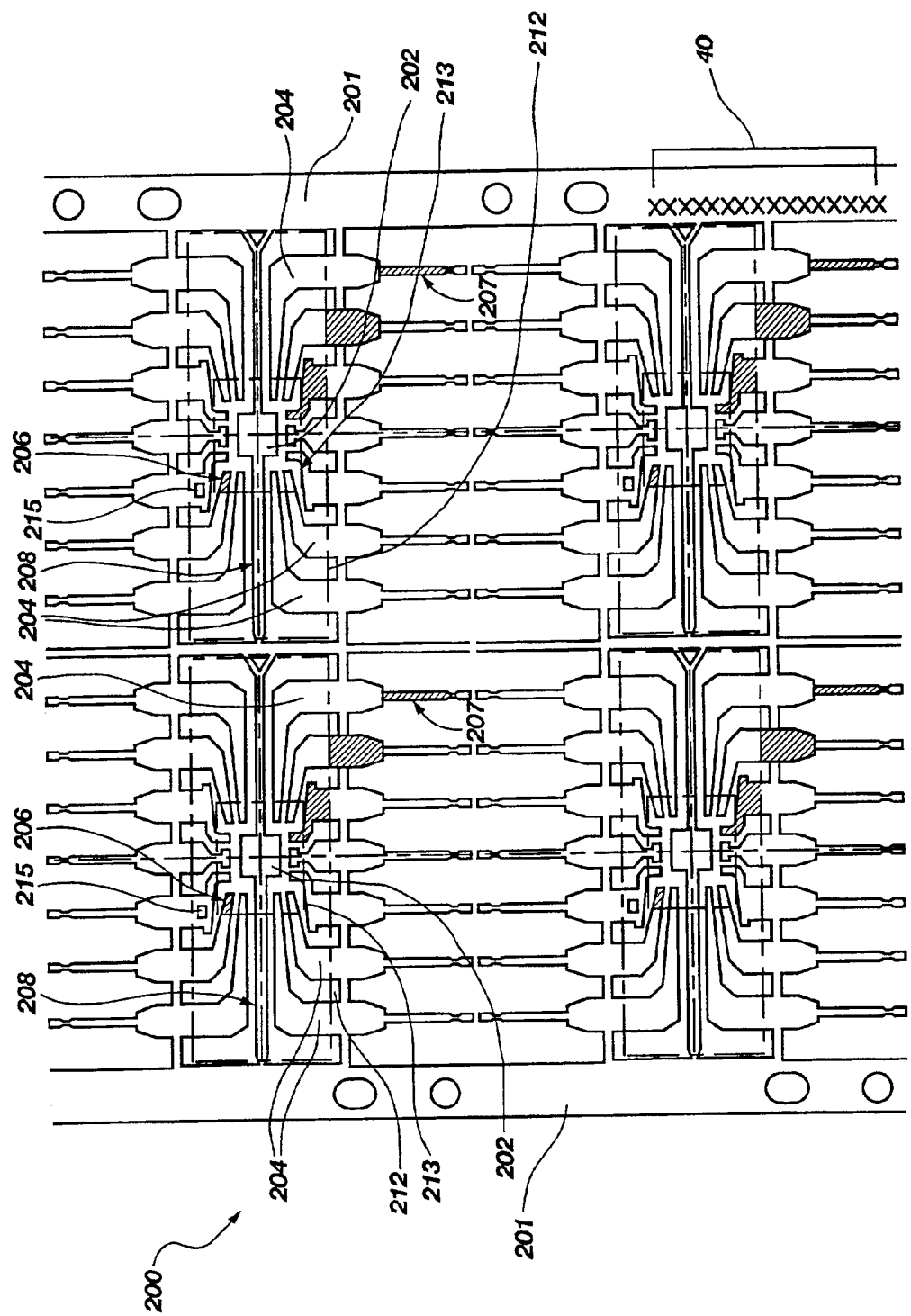
FIG. 4 shows a top view of a prior art lead frame array configured with a designator of the present invention.

As can be seen by drawing FIG. 4, lead frames may be manufactured as arrays (hereinafter referred to as "lead frame arrays"), the lead frame arrays having dimensions wide enough to accommodate a various number of semiconductor dice across a lead frame width. As illustrated in drawing FIG. 4, an exemplary lead frame array 200 is provided with a designator 40 located thereon. Lead frame array 200 includes an array of semiconductor die supporting pads (die paddles) 202, and a plurality of lead fingers 204 surrounding each die paddle 202. Each lead finger 204 has, in turn, a terminal bonding portion 206 near the die paddle 202 on which the semiconductor die is to be located and an external lead 207 for connection to external circuitry on a circuit board (not shown). Tie bars 208 are provided for support of die paddle 202, and a pair of parallel side rails 201 support tie bars 208. Lead frame array 200 may also includes a pin one indicator 215 used for orientation by the vision system of automated die-attach apparatus when mounting a semiconductor die to the die paddle 202. Functionally, the lead frame array 200 can be divided into a package area 212, which includes a semiconductor die-bonding area 213 therein as well as portions of lead fingers 204. The semiconductor bonding area 213 includes die paddle 202 and the free end of the terminal bonding portions 206 of lead fingers 204. In this arrangement, designator 40 is located in an otherwise unused peripheral surface area portion of lead frame array 200. As one example, designator 40 may be located on, or in close proximity to, a frame portion of lead frame array 200, such as an unused portion of side rails 201.

Referring again generally to drawing FIG. 3, designator 40 is preferably applied prior to the die-attach process. After mounting substrate array 50 fabrication, individual semiconductor die sites 60 of mounting substrate array 50 are tested and characterized for electrical and structural integrity by methods known in the art. For example, vision systems, such as PRS, can be used to examine structural defects such as broken leads, dendrite growth, solder resist irregularities, oxide contamination, corrosion, etc. In this step, the vision system will typically compare pictures of lead frame fingers, bond pads, and other features on and around the individual semiconductor die sites 60 to a predetermined known good template. Electrical testing can also be accomplished, for example, by use of various automated or other test equipment, including curve tracer testing, test probes, RF testing, and the like. Tests screening for intermittent failures, such as high-temperature reverse-bias (HTRB) testing, vibration testing, temperature cycling, and mechanical shock testing, etc., are also contemplated by the present invention, as well as tests for solderability, micro-corrosion, noise characterization, electro-migration stress, electrostatic discharge, plating defects, etc. The results of the different tests are fed into a computer, compiled, and correlated with individual semiconductor die sites 60 on a particular mounting substrate array 50. Semiconductor die sites 60 which are otherwise free from defects may then be classified as "known good semiconductor die sites or KGD sites".

This correlated test information is then encoded in the form of a designator 40, such as a bar code, marking, or other label, to be inscribed or placed on an unused peripheral surface area portion of mounting substrate array 50. Designator 40 thus contains computer readable information regarding the performance characteristics of one or more, or all of the individual semiconductor die sites. As used herein, information relating to the "performance characteristics" of a semiconductor die site at least includes information identifying defective semiconductor die sites on mounting substrate array 50. The correlated and compiled information encoded within designator 40 will also preferably contain information such as the history of the semiconductor die and the substrate, the lot number, and other information useful in fault verification and fault isolation analysis. Information encoded on designator 40 may also include instructions for orientating the mounting substrate array 50 during various processing, such as die attach and wire bonding. In an aspect of this embodiment, designator 40 may contain information relating to the proper pin one orientation and placement of the pin one of a semiconductor die in relation to the pin one mounting areas of individual semiconductor die sites on mounting substrate array 50.

Preferably, when patterned as a bar code or mark, designator 40 may be formed directly on an unused peripheral surface area portion of the mounting substrate array 50 by inscribing the peripheral region with a laser, such as an Nd:YAG (yttrium aluminum garnet) laser, Nd:YLP (pulsed ytterbium fiber) laser, carbon dioxide laser, or other suitable optical energy device known in the art. Since designator 40 is placed on a peripheral region of mounting substrate array 50, the laser ablation is not harmful to semiconductor die sites 60. To prevent contamination from particles typically found in the smoke resulting from a conventional laser ablative process, filtered air may be forced over the substrate. In a related alternative embodiment, a low-powered laser can mark an unused peripheral surface area portion of mounting substrate array 50 to a microscopic depth which could be read by surface holography methods. As a further alternative, the unused peripheral surface area portion of mounting substrate array 50 on which the laser mark or bar code is to be made may be provided with a coat, tape or film of a material known in the art to be resistant to the release of volatile materials. One such material is polytetrafluoroethylene (PTFE).

Designator 40 may also comprise a coded label or microlabel in the form of a tape or film which may be adhered or otherwise affixed to an unused peripheral surface area portion of mounting substrate array 50. Designator 40 may additionally be applied to an unused peripheral surface area portion of a mounting substrate by screen printing, photolithography, ink jet printing, or various material deposition processes, such as chemical vapor deposition, known in the art.

As a marking or label on an unused peripheral surface area portion of mounting substrate array 50, the computer readable information encoded by designator 40 may take the form of a plurality, sequence or string of identifying marks or characters. Thus, a mark or label formed or rendered in accordance with the methods of the present invention may comprise, for example, a string of alphanumeric characters, symbols, colors, or a binary sequence on a mounting substrate array surface that can be scanned by a laser on an LED, mechanically read by Optical Character Recognition (OCR), read by other computer-driven video equipment, or read by other suitable means known in the art.

Once scanned, information encoded in designator 40 is interpreted by a microprocessor of a die-bonding apparatus according to a predefined set of instructions. The microprocessor then uses the interpreted information in combination with the predefined set of instructions to direct the die-bonding apparatus as to which semiconductor die sites on the substrate array are defective. Generally, the microprocessor will use the encoded information to instruct the die-bonding apparatus to skip over those semiconductor die sites earmarked by designator 40 as defective. For certain strips where defective sites constitute 10% or greater of the total of semiconductor die sites, the information encoded by designator 40 may be correlated with instructions in the microprocessor to cause the die-bonding apparatus to discard the entire strip. In other strip arrays, higher numbers of defective semiconductor die sites are tolerated. The capacity of a particular strip array to tolerate defective semiconductor die sites may also be encoded by designator 40.

In a preferred embodiment, a coded strip of magnetic tape can be placed on and affixed to a mounting substrate 50 to act as the designator 40. Use of a magnetic strip for encoding information relating to the mounting substrate is advantageous in that magnetic strips are capable of encoding large amounts of information, they can be easily attached and removed, and they can be programmed or reprogrammed at various phases of semiconductor processing. As one example, a magnetic strip can be provided on a peripheral region of a mounting substrate after an array of semiconductor die sites and various conductors have been formed thereon. Information preliminarily encoded on the magnetic strip may include manufacturing information, such as various process specifications used in forming the mounting substrate. The magnetic strip may also include testing specifications and parameters, as well as identifying information, such as lot number, and time, date and place of manufacture, etc. After testing and visual inspection of the substrate and its associated semiconductor die sites, the various inspection information, including information concerning the performance of each semiconductor die site, may be added to the magnetic strip. This information can then be read by a magnetic reader and used, for example, in fault verification and fault isolation analysis, and/or the information can be used by a microprocessor to make decisions in later processing steps, such as die attach, wire bonding, encapsulation and singulation. At each stage of processing, the manufacturing, testing, and identifying information as previously set forth can be removed from or added to the magnetic strip on a continuing basis. Information encoded on the magnetic strip may also reflect reconditioning, repairs or other alternative processing steps performed on the substrate.

As previously described, the computer readable information of designator 40 may preferably be in the form of a bar code symbol comprising a number of printed bars and intervening spaces, the bars and spaces forming patterns of light and dark areas. The bar code is typically read by use of a low-powered laser as a light source and a sensor to detect reflections from the light areas of the bar code. The reflected pattern detected by the sensor converts light energy into electrical energy. The result is an electrical signal that can be converted into data. The data can then be used to reconstruct the bar code image by a decoder (microprocessor), which then compares the reconstructed image with images representing various characters or symbols previously stored in a computer database. Preferably, the bar codes used in the present invention make use of Code 39, which uses alphanumeric symbols allowing for the bar coding of numbers, letters, and some punctuation. The bar codes that may be used in the present invention are without limitation, however, and may include UPC, EAN, Code 93, Code 128, Codabar, MSI, Interleaved 2 of 5, etc. "Interleaved 2 of 5" is particularly desirable for simple encoding in very small regions of mounting substrate array 50 because of its highly compact nature.

In an additional embodiment, test and inspection information correlated with individual semiconductor die sites and a particular substrate configuration can be used to create a computerized map of the substrate, the computerized substrate map comprising test and inspection data related to the functionality of one or more semiconductor die sites and stored in computer memory. Data within the computer memory may then be transferred electronically to the semiconductor die-bonding station to attach semiconductor dice only to KGD sites. This embodiment minimizes or eliminates the step of inscribing a bar code or mark, or affixing a tape, film, label or micro-label on the mounting substrate, thus preserving valuable substrate real estate, minimizing the handling of the mounting substrate array 50, and lessening the potential for damaging the mounting substrate array 50. The computerized substrate map, however, may also be used in combination with the bar code inscription, marking or labeling methods of the present invention. In one aspect of this embodiment, a unique mark, symbol or other identifier may be provided to mounting substrate 50 for purposes of distinguishing a particular mounting substrate from others in the production line. This embodiment may be useful in preventing errors introduced during transfer of the mounting substrate 50 and the corresponding computerized substrate map test data.

The use of designator 40 provides numerous advantages as compared to prior art methods of identifying defective semiconductor die sites by manually inking-out one or more features. First, the present invention advantageously takes up no real estate on a semiconductor die site. As the industry demand for smaller packages continues to escalate, the space available for unique features (such as pin one indicators) becomes increasingly smaller. Thus, the present invention anticipates the industry's future needs, and is particularly advantageous when used in combination with substrate arrays for producing chip scale, or near chip scale, packages. Second, the invention requires no openings in the solder resist of an individual semiconductor device package, thus allowing for a more planar solder resist surface for clamping to reduce resin bleed during a mold encapsulation process. Third, the present invention avoids the problems inherent in "inking-out" the very small, unique features on die sites, including problems associated with operator error and ink contamination due to ink bleeding, smearing, or spraying. Additionally, the present invention provides for a completely automated process of identifying and recording multiple defective semiconductor die sites on a substrate, thus allowing throughput to be increased substantially. Finally, information relating to the processing, design specifications, and other history of a mounting substrate array can be included in the information encoded by designator 40, thus substantially advancing the practice of fault isolation and verification.

It will be appreciated by those skilled in the art that the embodiments herein described, while illustrating certain embodiments, are not intended to so limit the invention or the scope of the appended claims. Those skilled in the art will also understand that various combinations or modifications of the preferred embodiments could be made without departing from the scope of the invention.

For example, this invention, while being described with reference to the die sites of a substrate array, has equal utility to any type of mounting substrate used for semiconductor devices or related circuitry. As one example, the designator 40 of the present invention could be placed on an off-site surface of a mounting substrate configured with a single semiconductor die site, or a mounting substrate strip configured with a single row of semiconductor die sites. Automated apparatus could then read the information encoded on the designator to make decisions regarding die attach or fault analysis and verification. The embodiments of the present invention are also contemplated for locating designator 40 on mounting substrate surfaces other than a surface most closely associated with the one or more semiconductor die sites on the substrate. Accordingly, the present invention can be utilized on the side edge portions or a backside surface of a mounting substrate or mounting substrate array.

Thus, while certain representative embodiments and details have been shown for purposes of illustrating the invention, it will be apparent to those skilled in the art that various changes in the invention disclosed herein may be made without departing from the scope of the invention, which is defined in the appended claims.

What is claimed is:

1. A method of assembling a semiconductor package comprising:

providing a substrate having at least one semiconductor die site;

inspecting the at least one semiconductor die site for defects;

forming a descriptor having information relating to the at least one semiconductor die site wherein forming a descriptor is accomplished by one of a group consisting of encoding information in the form of a computerized map of the substrate and forming a magnetic strip on a surface of the substrate; and selecting between attaching a semiconductor die to the at least one semiconductor die site and not attaching a semiconductor die to the at least one semiconductor die site, responsive to the descriptor.

2. The method according to claim 1, wherein selecting between attaching a semiconductor die to the at least one semiconductor die site and not attaching a semiconductor die to the at least one semiconductor die site comprises: transferring data from the computerized map of the substrate to a die attach apparatus; and operating the die attach apparatus responsive to the data.

3. The method according to claim 1, wherein selecting between attaching a semiconductor die to the at least one semiconductor die site and not attaching a semiconductor die to the at least one semiconductor die site comprises:

reading data from the descriptor; and evaluating the data for information relating to at least one defect associated with the at least one semiconductor die site.

4. The method according to claim 1, wherein the descriptor consists of machine readable information on a surface of the substrate wherein the machine readable information is formed by one of the group consisting of screen printing, photo-lithography and chemical vapor deposition.

5. The method according to claim 4, wherein encoding machine readable information on a surface of the substrate comprises forming marks in the surface of the substrate with optical energy.

6. The method according to claim 5, further comprising: forcing air over the substrate while forming marks in the surface of the substrate with optical energy.

7. The method according to claim 5, further comprising:
coating a least part of the surface of the substrate with a material resistant to releasing volatile materials prior to forming marks in the surface of the substrate with optical energy.

8. The method according to claim 5, wherein forming marks in the surface of the substrate with optical energy comprises forming marks to a microscopic depth in the surface of the substrate with a low-powered laser.

9. The method according to claim 4, wherein encoding machine readable information on the surface of the substrate comprises forming the machine readable information as at least one mark selected from the group consisting of alphanumeric characters, symbols, colors, binary sequences and combinations thereof.

10. The method according to claim 1, wherein the at least one semiconductor die site comprises a plurality of semiconductor die sites, and further comprising: reading the descriptor for a semiconductor die site defect percentage; and discarding the substrate if the defect percentage exceeds a threshold percentage.

* * * * *